US011095816B2

(12) United States Patent
Senda

(10) Patent No.: US 11,095,816 B2
(45) Date of Patent: Aug. 17, 2021

(54) IMAGE PICKUP ELEMENT, IMAGE PICKUP METHOD, AND ELECTRONIC DEVICE FOR IMAGE STABILIZATION

(71) Applicant: SONY SEMICONDUCTOR SOLUTIONS CORPORATION, Kanagawa (JP)

(72) Inventor: Keiichi Senda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/340,903

(22) PCT Filed: Nov. 17, 2017

(86) PCT No.: PCT/JP2017/041418
§ 371 (c)(1),
(2) Date: Apr. 10, 2019

(87) PCT Pub. No.: WO2018/101077
PCT Pub. Date: Jun. 7, 2018

(65) Prior Publication Data
US 2019/0281220 A1 Sep. 12, 2019

(30) Foreign Application Priority Data
Dec. 2, 2016 (JP) .............................. JP2016-235132

(51) Int. Cl.
*H04N 5/232* (2006.01)
*H01L 27/146* (2006.01)
*H04N 5/235* (2006.01)

(52) U.S. Cl.
CPC ... *H04N 5/23254* (2013.01); *H01L 27/14605* (2013.01); *H04N 5/232* (2013.01); *H04N 5/2353* (2013.01); *H04N 5/23267* (2013.01)

(58) Field of Classification Search
CPC .......... H04N 5/23254; H04N 5/23267; H04N 5/232; H04N 5/2353; H01L 27/14605
See application file for complete search history.

(56) References Cited

U.S. PATENT DOCUMENTS

| | | | | |
|---|---|---|---|---|
| 6,122,446 | A * | 9/2000 | Satoh | G02B 27/646 396/52 |
| 7,239,342 | B2 * | 7/2007 | Kingetsu | H04N 5/23248 348/208.12 |

(Continued)

FOREIGN PATENT DOCUMENTS

| CN | 101026691 A | 8/2007 |
|---|---|---|
| CN | 101692692 A | 4/2010 |

(Continued)

OTHER PUBLICATIONS

International Search Report and Written Opinion of PCT Application No. PCT/JP2017/041418, dated Jan. 9, 2018, 09 pages of ISRWO.

(Continued)

*Primary Examiner* — Luong T Nguyen
(74) *Attorney, Agent, or Firm* — Chip Law Group

(57) ABSTRACT

The present disclosure relates to an image pickup element, an image pickup method, and an electronic device that achieve a better image stabilization effect. A pixel array unit in which a plurality of pixels are arranged in an array outputs a plurality of frames by EIS imaging that continuously performs short-time exposure imaging at high speed. Then, the exposure control unit determines whether or not a blur of the pixel array unit exceeds a prescribed value on the basis of blur information indicating a physical blur in a case where the pixel array unit is shaken, and causes the pixel array unit to perform EIS imaging until it is determined that the blur of the pixel array unit exceeds the prescribed value. The (Continued)

present technology can be applied to, for example, a CMOS image sensor having an electronic image stabilization function.

7 Claims, 8 Drawing Sheets

(56) References Cited

U.S. PATENT DOCUMENTS

| | | | | |
|---|---|---|---|---|
| 7,961,233 | B2* | 6/2011 | Yamasaki | H04N 5/23277 348/208.1 |
| 8,692,933 | B1* | 4/2014 | Namboodri | H04N 19/513 348/441 |
| 2007/0094175 | A1* | 4/2007 | Axling | G06F 17/50 706/19 |
| 2007/0195180 | A1 | 8/2007 | Yamasaki | |
| 2008/0080053 | A1* | 4/2008 | Homme | H04N 5/23258 359/554 |
| 2013/0201364 | A1* | 8/2013 | Shimizu | H04N 5/2353 348/229.1 |
| 2015/0022678 | A1* | 1/2015 | Tsubaki | H04N 5/23254 348/208.5 |
| 2015/0341531 | A1 | 11/2015 | Senda | |
| 2016/0360111 | A1* | 12/2016 | Thivent | H04N 5/23287 |
| 2019/0281220 | A1 | 9/2019 | Senda | |

FOREIGN PATENT DOCUMENTS

| | | |
|---|---|---|
| CN | 102480595 A | 5/2012 |
| CN | 102540627 A | 7/2012 |
| CN | 102769718 A | 11/2012 |
| CN | 104994305 A | 10/2015 |
| CN | 105100585 A | 11/2015 |
| JP | 2005-038396 A | 2/2005 |
| JP | 2007-228297 A | 9/2007 |
| JP | 2008-219124 A | 9/2008 |
| JP | 2010-239277 A | 10/2010 |
| JP | 2015-220690 A | 12/2015 |
| WO | 2014/156731 A1 | 10/2014 |

OTHER PUBLICATIONS

Office Action for CN Patent Application No. 201780072808.2, dated May 12, 2021, 06 pages of English Translation and 05 pages of Office Action.

* cited by examiner

IMAGE PICKUP ELEMENT, IMAGE PICKUP METHOD, AND ELECTRONIC DEVICE FOR IMAGE STABILIZATION

CROSS REFERENCE TO RELATED APPLICATIONS

This application is a U.S. National Phase of International Patent Application No. PCT/JP2017/041418 filed on Nov. 17, 2017, which claims priority benefit of Japanese Patent Application No. JP 2016-235132 filed in the Japan Patent Office on Dec. 2, 2016. Each of the above-referenced applications is hereby incorporated herein by reference in its entirety.

TECHNICAL FIELD

The present disclosure relates to an image pickup element, an image pickup method, and an electronic device and in particular, relates to an image pickup element, an image pickup method, and an electronic device that achieve a better image stabilization effect.

BACKGROUND ART

Conventionally, as techniques for correcting a blur which occurs due to a camera shake while capturing an image, an optical image stabilization (OIS) and electronic image stabilization (EIS) are generally used.

For example, in the optical image stabilization, an image blur can be corrected by moving a lens in a direction opposite to a movement detected by a gyro sensor or the like to shift an image formed on an image pickup element.

However, the optical image stabilization complexes the system for moving the lens and increases its power consumption, for example, and also, since a control system for image stabilization and the image pickup element are provided as individual parts, it has been difficult to control them in conjunction with each other. Furthermore, in the optical image stabilization, it is needed to provide a drive portion in each correction direction and, in order to avoid the complexity of the system, only a blur in a yaw direction and a pitch direction is corrected and a blur in a roll direction is not corrected in a compact device.

On the other hand, in the electronic image stabilization, a blur of an image can be corrected by performing image processing for superimposing a plurality of images obtained by continuously performing high-speed imaging with short time exposure that may cause little blurring.

For example, Patent Document 1 discloses an image processing method capable of outputting a sharp image converted to a same brightness as the proper exposure from a plurality of images captured at a speed faster than a shutter speed at the proper exposure. In addition, Patent Document 2 discloses a solid-state image pickup element capable of effectively correcting distortion which occurs in an image due to a camera shake according to a correction amount based on a blur angle detected by a gyro sensor and an arrangement position of pixels constituting the image.

CITATION LIST

Patent Document

Patent Document 1: International Publication No. 2014/156731

Patent Document 2: Japanese Patent Application Laid-Open No. 2005-38396

SUMMARY OF THE INVENTION

Problems to be Solved by the Invention

However, in the conventional electronic image stabilization, since its image stabilization effect is lower than the optical image stabilization, electronic image stabilization capable of obtaining a better image stabilization effect has been demanded.

The present disclosure has been made in view of such circumstances, and has an object to obtain a better image stabilization effect.

Solutions to Problems

An image pickup element according to one aspect of the present disclosure includes a pixel array unit including a plurality of pixels arranged in an array and configured to output a plurality of frames by EIS imaging that continuously performs short-time exposure imaging at high speed, and an exposure control unit configured to determine whether or not a blur of the pixel array unit exceeds a prescribed value on the basis of blur information indicating a physical blur in a case where the pixel array unit is shaken and cause the pixel array unit to perform EIS imaging until it is determined that the blur of the pixel array unit exceeds the prescribed value.

An image pickup method according to one aspect of the present disclosure is an image pickup method of an image pickup device having a pixel array unit including a plurality of pixels arranged in an array and outputting a plurality of frames by EIS imaging that continuously performs short-time exposure imaging at high speed, and the method includes determining whether or not a blur of the pixel array unit exceeds a prescribed value on the basis of blur information indicating a physical blur in a case where the pixel array unit is shaken, and causing the pixel array unit to perform EIS imaging until it is determined that the blur of the pixel array unit exceeds the prescribed value.

An electronic device according to one aspect of the present disclosure includes an image pickup element having a pixel array unit including a plurality of pixels arranged in an array and configured to output a plurality of frames by EIS imaging that continuously performs short-time exposure imaging at high speed, and an exposure control unit configured to determine whether or not a blur of the pixel array unit exceeds a prescribed value on the basis of blur information indicating a physical blur in a case where the pixel array unit is shaken, and cause the pixel array unit to perform EIS imaging until it is determined that the blur of the pixel array unit exceeds the prescribed value.

According to one aspect of the present disclosure, a pixel array unit in which a plurality of pixels are arranged in an array outputs a plurality of frames by EIS imaging that continuously performs short-time exposure imaging at high speed. Then, it is determined whether or not a blur of the pixel array unit exceeds the prescribed value on the basis of blur information indicating a physical blur in a case where the pixel array unit is shaken, and the pixel array unit is caused to perform the EIS imaging until it is determined that the blur of the pixel array unit exceeds the prescribed value.

Effects of the Invention

According to one aspect of the present disclosure, a better image stabilization effect can be obtained.

MODE FOR CARRYING OUT THE INVENTION

Hereinafter, a specific embodiment to which the present technology is applied will be described in detail with reference to the drawings.

Configuration Example of Image Pickup Element

Figure 1:
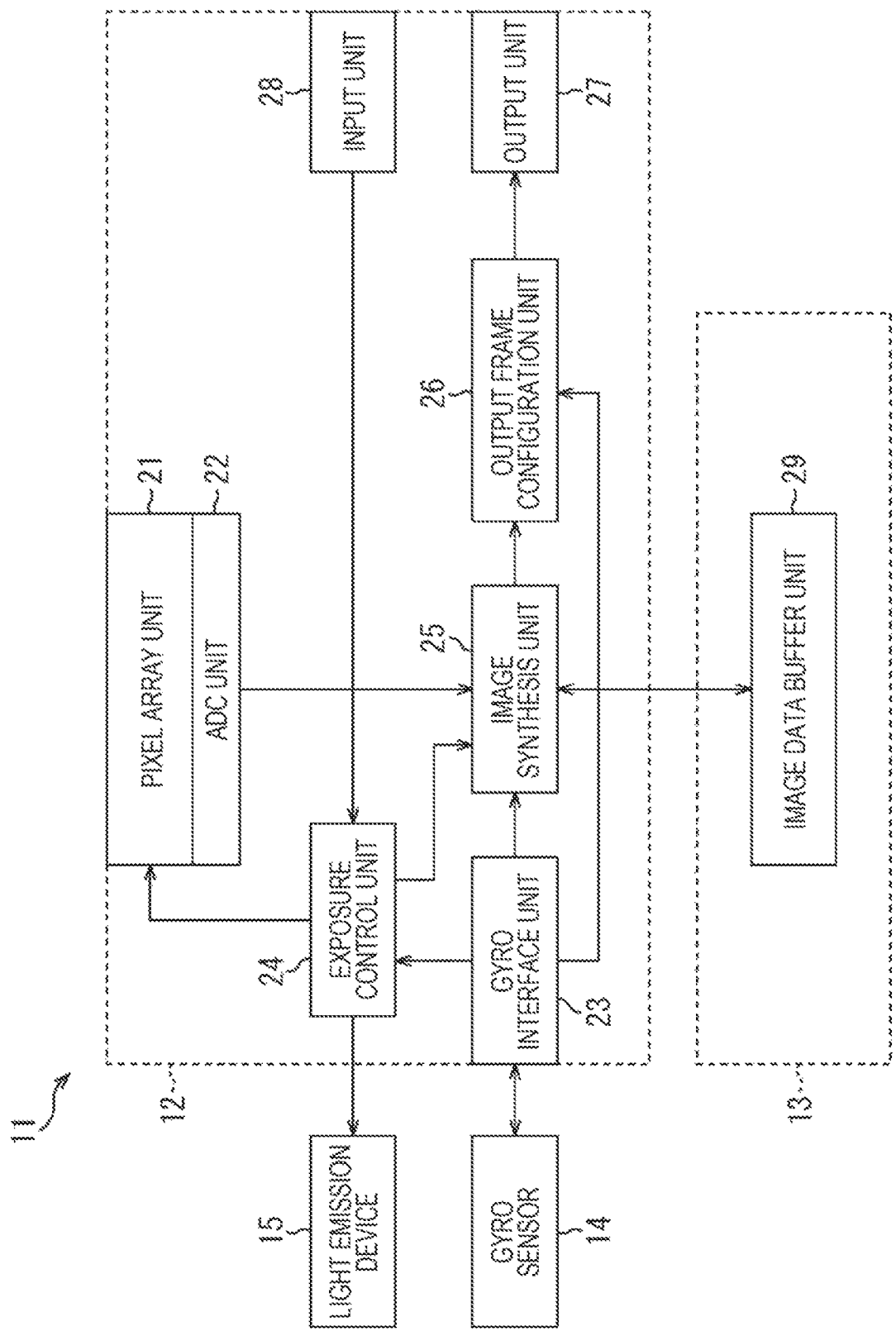
FIG. 1 is a block diagram illustrating a configuration example of an embodiment of an image pickup element using the present technology.

FIG. 1 is a block diagram illustrating a configuration example of an embodiment of an image pickup element to which the present technology is applied.

The image pickup element 11 illustrated in FIG. 1 is formed with a laminating a memory chip 13 laminated on an imaging chip 12 having a laminated structure of a sensor substrate and a signal processing substrate and the imaging chip 12 is connected with a gyro sensor 14 and a light emission device 15.

The imaging chip 12 includes a pixel array unit 21, an analog to digital converter (ADC) unit 22, a gyro interface unit 23, an exposure control unit 24, an image synthesis unit 25, an output frame configuration unit 26, an output unit 27, and an input unit 28.

The pixel array unit 21 is an imaging plane formed with a plurality of pixels arranged in an array to receive light condensed by an unillustrated optical system and output a pixel signal in a level corresponding to a light amount of the light received by each pixel. For example, under control by the exposure control unit 24, the pixel array unit 21 continuously performs EIS imaging which causes little blurring by imaging at high speed with a short exposure time, and outputs pixel signals which compose a plurality of frames.

The ADC unit 22 performs, for example, correlated double sampling (CDS) processing on the pixel signals output from the pixel array unit 21 to perform AD conversion of the pixel signals and remove reset noise.

The gyro interface unit 23 acquires gyro data (blurring information) output from the gyro sensor 14, and supplies the gyro data (blurring information) to the exposure control unit 24, the image synthesis unit 25, and the output frame configuration unit 26 according to need. In addition, as will be described later with reference to FIG. 5, the gyro interface unit 23 manages the supply of the gyro data so that the image and the gyro data are synchronized.

The exposure control unit 24 performs exposure control based on gyro data supplied from the gyro interface unit 23 and control information (exposure time, gain, etc.) supplied from an unillustrated external processor via the input unit 28. For example, the exposure control unit 24 causes the pixel array unit 21 to perform EIS imaging by dividing the exposure time given by the processor into short exposure time that causes little blurring. Furthermore, in a case where the EIS imaging by the pixel array unit 21 is completed, the exposure control unit 24 causes the image synthesis unit 25 to perform image synthesis. Furthermore, the exposure control unit 24 causes the light emission device 15 to perform strobe light emission at predetermined timing.

A pixel signal is supplied from the ADC unit 22 to the image synthesis unit 25, and the image synthesis unit 25 performs image synthesis for synthesizing the plurality of frames captured by the pixel array unit 21 under the control by the exposure control unit 24 and supplies a synthesized image to the output frame configuration unit 26. For example, the image synthesis unit 25 performs image processing for synthesizing each of the plurality of frames as shifting each of the plurality of frames in a direction of correcting the camera shake generated in the image, on the basis of a motion vector obtained from the gyro data supplied from the gyro interface unit 23.

The output frame configuration unit 26 forms a frame in an output format in which embedded data or the like is added to the image supplied from the image synthesis unit 25 and outputs the frame via the output unit 27.

The output unit 27 is an interface for outputting the output frame supplied from the output frame configuration unit 26 to outside of the image pickup element 11 in compliance with, for example, Camera Serial Interface 2 (CSI).

The input unit 28 is an interface that receives control information from a processor (not illustrated) in compliance with camera control interface (CCI), for example, and supplies the control information to the exposure control unit 24.

The memory chip 13 includes an image data buffer 29, and the image data buffer 29 temporarily stores, for example, the plurality of frames used by the image synthesis unit 25 to perform image synthesis.

The gyro sensor 14 is mounted in a vicinity of the image pickup element 11, and physically detects (not by processing an image) a shake angle that the image pickup element 11 has been shaken. For example, the gyro sensor 14 is a detection unit that detects an angular velocity, and outputs gyro data indicating a camera shake amount represented by a shake angle obtained from the angular velocity detected at constant timing.

Under the control by the exposure control unit 24, the light emission device 15 emits strobe light having strong brightness to a subject.

The image pickup element 11 is configured in this manner so that the exposure control unit 24 can determine whether or not a blur of the pixel array unit 21 exceeds the prescribed value on the basis of the gyro data output from the gyro sensor 14 (for example, angular velocity: 2 degrees/second) and cause the pixel array unit 21 to perform EIS imaging until it is determined that the blur exceeds the prescribed value. With this configuration, the image pickup element 11 can acquire a higher quality EIS image by extending the total exposure time of the EIS image than the exposure time given from the processor. Or, the image pickup element 11 can avoid occurrence of blurring in the EIS image even within the exposure time given from the processor.

Note that, in a complementary metal oxide semiconductor (CMOS) image sensor, an image is generally captured by a focal plane shutter in which exposure starts sequentially for each row of pixels and a pixel signal is read out. In the following description with reference to the drawings, an image acquired by such a focal plane shutter is represented by a parallelogram.

<Conventional OIS Imaging and EIS Imaging>

Figure 2:
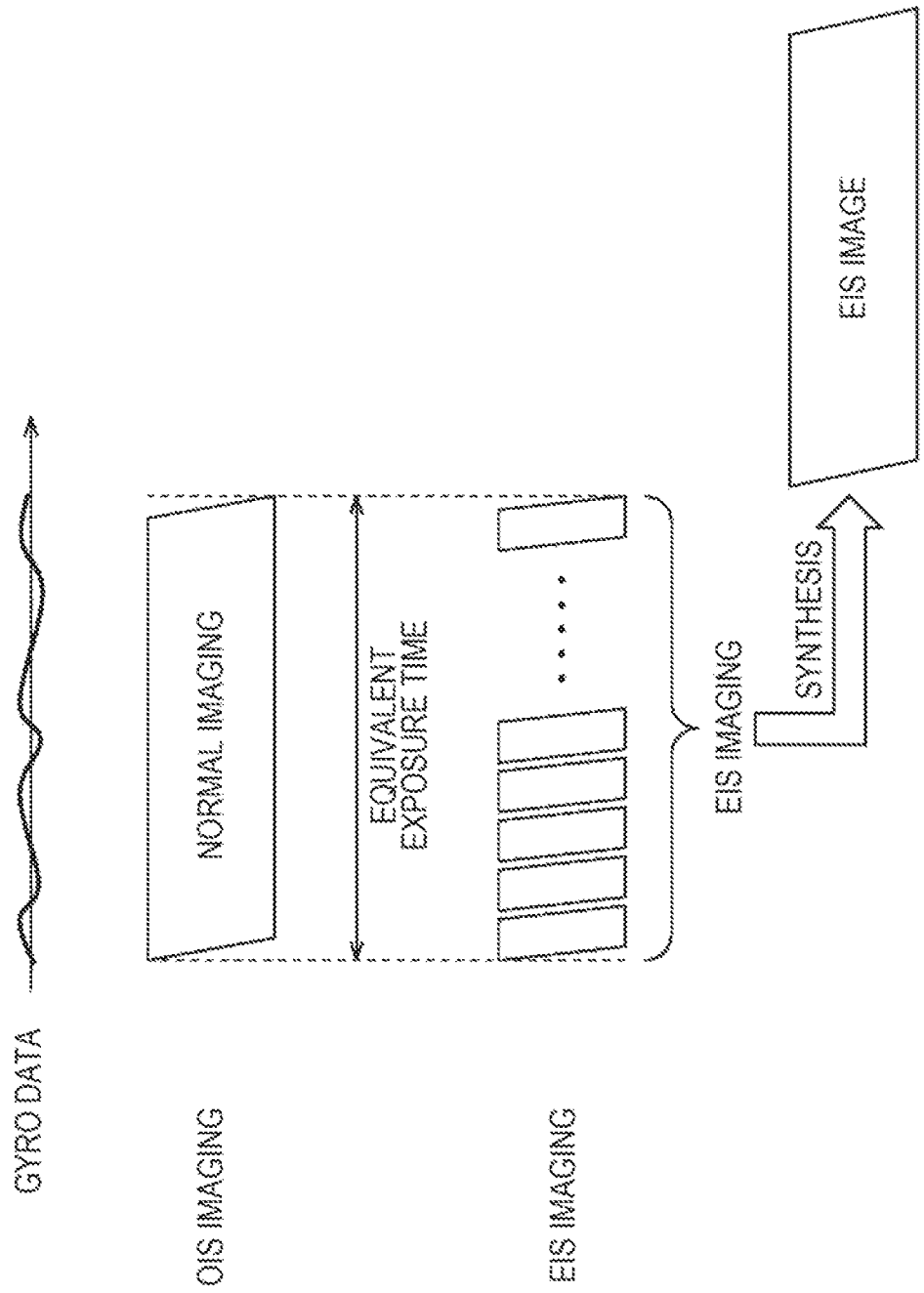
FIG. 2 is a diagram illustrating conventional OIS imaging and EIS imaging.

With reference to FIG. 2, conventional OIS imaging and EIS imaging will be described.

For example, in OIS imaging, ordinary imaging is performed, in which images stabilized by OIS are acquired according to the exposure time and gain given from the processor.

Furthermore, in the EIS imaging, the exposure time (equivalent to the exposure time in OIS imaging) given by the processor is divided into a short period of time which does not cause a camera shake, a plurality of frames are captured, and the frames are synthesized so that a single stabilized EIS image is acquired.

In such OIS imaging and EIS imaging, imaging is performed according to imaging conditions (exposure time, gain, etc.) given from the processor. Since this imaging condition is controlled on the basis of the longest exposure time presumed from its OIS performance and the like, higher image quality may be expected by further performing imaging with long-time exposure within a range that allows image stabilization characteristics.

<EIS Imaging Using the Present Technology>

Figure 3:
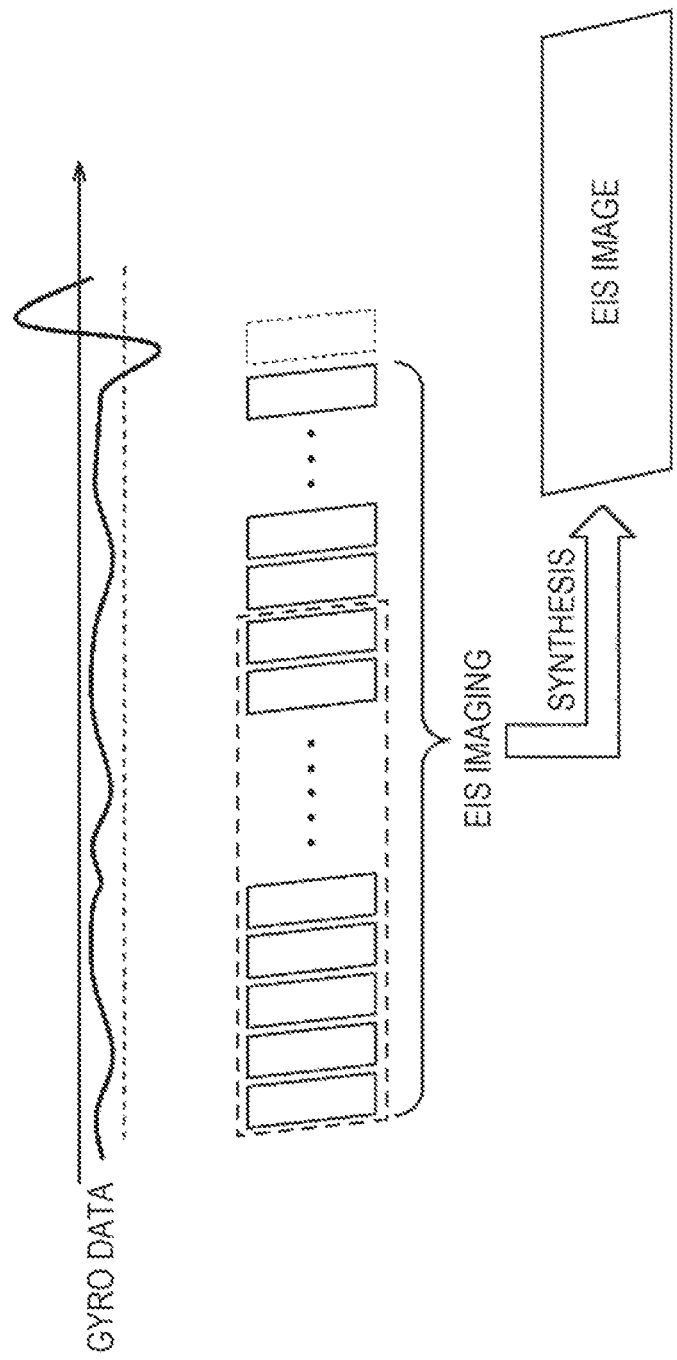
FIG. 3 is a diagram illustrating EIS imaging using the present technology.
Figure 4:
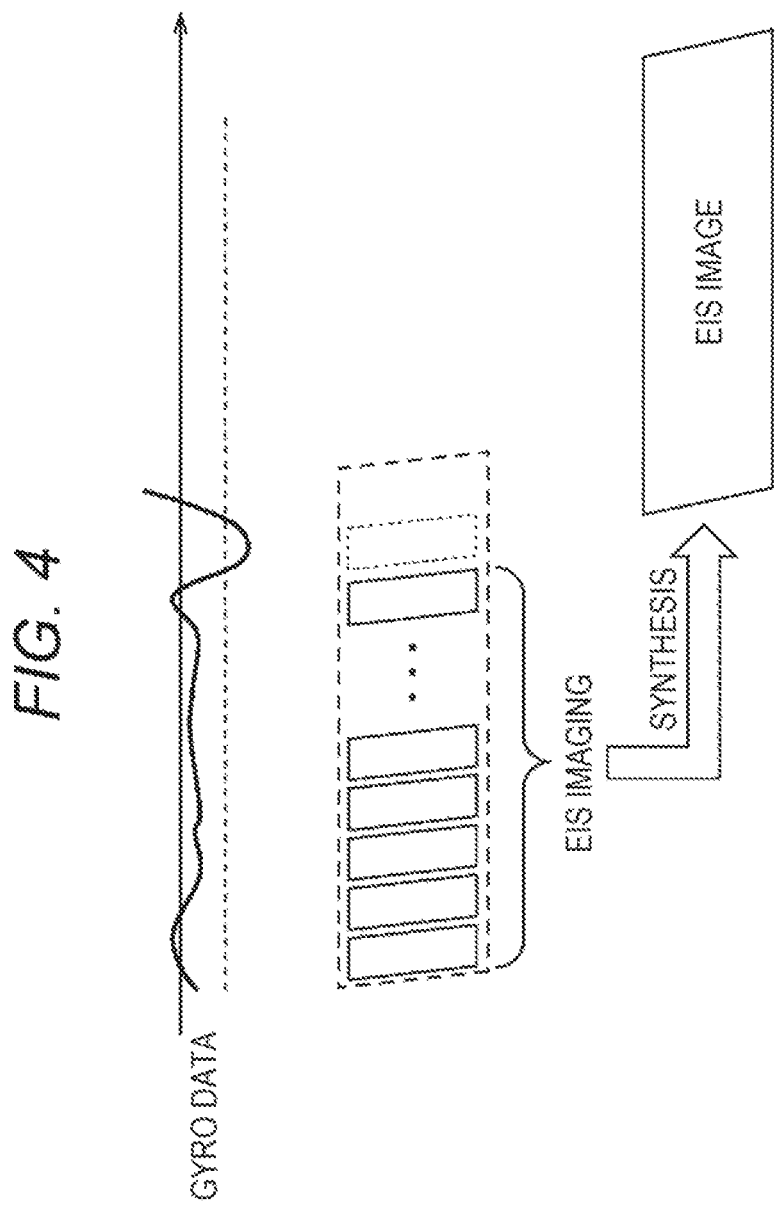
FIG. 4 is a diagram illustrating EIS imaging using the present technology.

With reference to FIGS. 3 and 4, EIS imaging by the image pickup element 11 of FIG. 1 will be described.

For example, in FIGS. 3 and 4, the broken line parallelograms represent exposure time given by the processor, and, conventionally, control is executed so that a sum of the exposure time of the EIS imaging becomes equivalent to the exposure time given by the processor.

In contrast, in the image pickup element 11, the exposure control unit 24 directly observes the gyro information output from the gyro sensor 14 via the gyro interface unit 23, and determines whether or not a large blur that gyro data exceeds a prescribed value (a broken straight line) has occurred. Then, the exposure control unit 24 causes the pixel array unit 21 to continue the EIS imaging until it is determined that a large blur that gyro data exceeds the prescribed value has occurred.

For example, as illustrated in FIG. 3, in a case where a large blur that the gyro data exceeds the prescribed value occurs after the exposure time given by the processor has elapsed, the exposure control unit 24 causes the pixel array unit 21 to terminate the EIS imaging at that timing. Then, the exposure control unit 24 causes the image synthesis unit 25 to synthesize the images using the frames immediately before the occurrence of the blur, and the image synthesis unit 25 synthesizes the frames to output a single stabilized EIS image.

As a result, the image pickup element 11 can extend the total sum of the exposure time in the EIS imaging to be longer than the exposure time given from the processor. In general, especially in a low illuminance environment, since the image quality can be improved in a case where the total sum of the exposure time is longer, the image pickup element 11 can acquire a high quality image with a better image stabilization effect.

On the other hand, as illustrated in FIG. 4, in a case where a large blur that makes the gyro data exceed the prescribed value occurs before the exposure time given by the processor elapses, at that timing, the exposure control unit 24 causes the pixel array unit 21 to terminate the EIS imaging. Then, the exposure control unit 24 causes the image synthesis unit 25 to synthesize the images using the frames immediately before the occurrence of the blur, and the image synthesis unit 25 synthesizes the frames to output a single stabilized EIS image.

As a result, the image pickup element 11 can terminate the EIS imaging before the image blur occurs and exclude the image including such a blur having occurred not to be used in the image synthesis. In this case, the image pickup element 11 cannot acquire a high-quality image as described with reference to FIG. 3; however, imaging failure due to a camera shake can be prevented.

As described above, in the image pickup element 11, the imaging chip 12 directly acquires the gyro data output from the gyro sensor 14 and performs exposure for as long as possible so that, for example, image quality can be improved in imaging under a low illuminance environment, compared to a conventional art. Furthermore, the image pickup element 11 can avoid imaging failures even in a case where an unexpected large camera shake occurs during the exposure time given by the processor.

Furthermore, in the OIS imaging, for example, since the image stabilization function is realized by moving one of the optical component and the image pickup element in a direction to cancel the camera shake, a driving component needs to be provided to each correction axis. Therefore, in general, in an image pickup device adopted in a small device such as a so-called smartphone, only a blur in a yaw direction and a pitch direction has been corrected. On the other hand, the image pickup element 11 can take advantage of the EIS imaging and can correct a blur in a roll direction in addition to the yaw direction and the pitch direction without adding a driving component or the like.

<Synchronization of Gyro Data>

Figure 5:
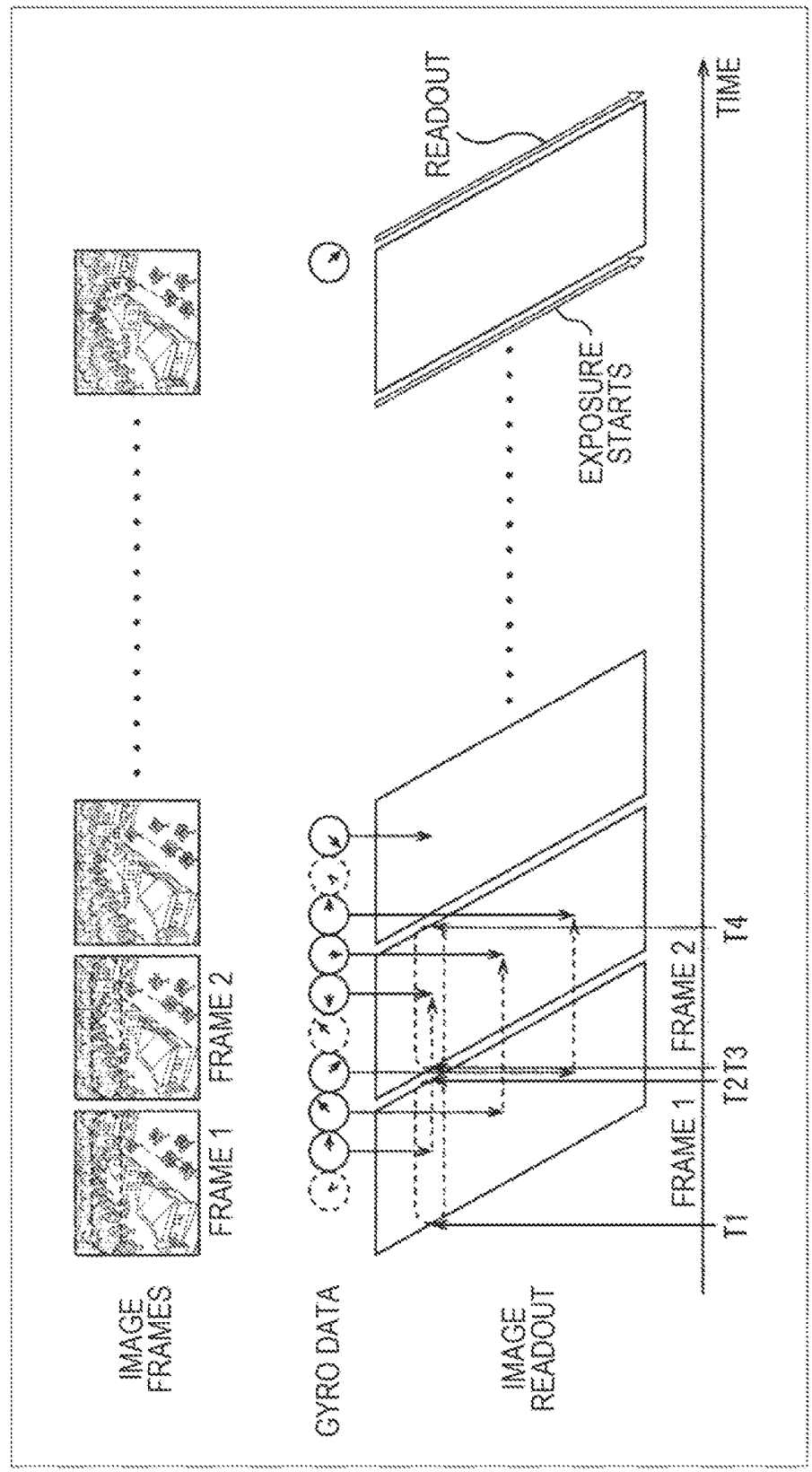
FIG. 5 is a diagram illustrating synchronization between an image and gyro data.

With reference to FIG. 5, synchronization between the image and the gyro data in the image pickup element 11 will be described.

In general, displacement information between frames in a case of synthesizing a plurality of frames in EIS imaging is important, and a camera shake can be corrected by canceling the displacement. Furthermore, in the CMOS image sensor used for the image pickup element 11, the focal plane shutter is used as an electronic shutter system so that reading time deviation in the image occurs. For this reason, in a case where reading time deviation in the image due to the focal plane shutter and positional deviation between the frames due to camera shake are overlapped, and further deterioration of the image quality may occur.

Therefore, the image pickup element 11 synchronizes the image and the gyro data, accurately recognizes an amount of the shake in each position in the vertical direction in each frame, and correctly corrects these deviations, so that correction for the camera shake caused in the image can be effectively performed.

In the upper side of FIG. 5, a plurality of frames acquired by performing the EIS imaging by the pixel array unit 21 are illustrated and, in the lower side of FIG. 5, exposure start timing and read timing are illustrated.

As an example, exposure a position in the vertical direction surrounded by the broken lines in the first frame 1 and the second frame 2 will be considered. Here, the exposure center at the position surrounded by the broken line in the frame 1 is time T1+((time T2−T1)/2. Furthermore, the exposure center at the position enclosed by the broken lines in the frame 2 is time T3+((time T4−T3)/2. Then, the motion vector used for superimposing the frames in the EIS imaging is a movement amount from the exposure center of the frame 1 to the exposure center of the frame 2.

Then, in the image pickup element 11, the exposure control unit 24 can synchronize the gyro data supplied from the gyro interface unit 23 with the imaging timing by the pixel array unit 21, so that a motion vector from the exposure center of the frame 1 to the exposure center of the frame 2 can be accurately acquired.

In other words, by synchronizing the image reading and the gyro data reading, the image pickup element 11 can accurately recognize the displacement amount at each position in the vertical direction between the frames. As a result, the image synthesis unit 25 can synthesize the frames using the displacement amount synchronized for each position in the vertical direction of each frame. Therefore, the image pickup element 11 suppresses deterioration of image quality caused by overlapping reading time deviation within the image by the focal plane shutter and positional deviation between the frames due to a camera shake to perform more effective image stabilization. In other words, since the image pickup element 11 can perform image stabilization based on the displacement amount with high precision and in detail, frame synchronization can be performed at a high quality, and the improved image quality of the EIS image obtained by synthesizing a plurality of frames can be achieved.

In addition, in the image pickup element 11, since the imaging chip 12 and the gyro sensor 14 can perform control in conjunction with each other, effect of extension of the exposure time as a result of mounting the image stabilization can be maximized, compared to a conventional image pickup element in which control using such conjunction is difficult.

<EIS Imaging Combined with Strobe Light Emission>

Figure 6:
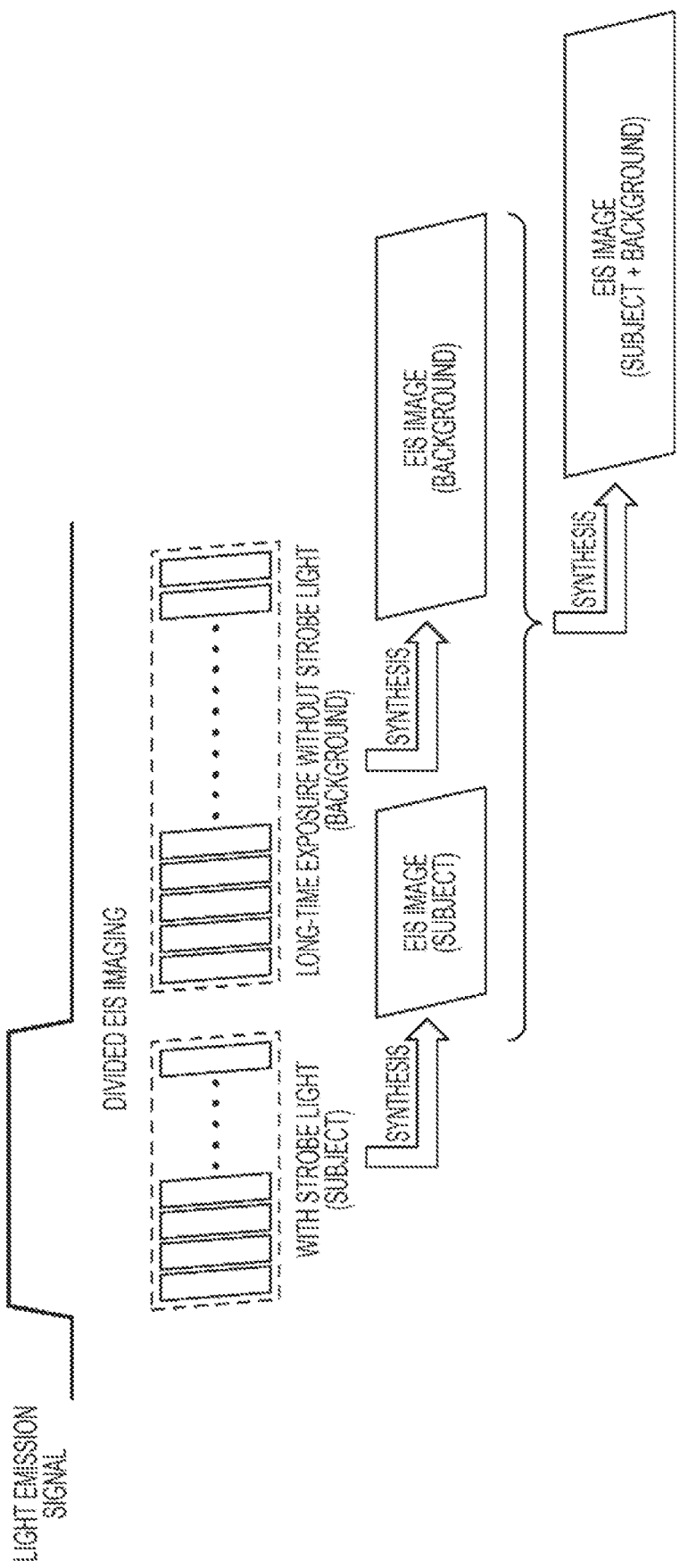
FIG. 6 is a diagram for explaining EIS imaging in which strobe light emission is combined.

With reference to FIG. 6, EIS imaging combined with strobe light emission will be described.

As illustrated in FIG. 6, firstly, the exposure control unit 24 sets the light emission signal to be supplied to the light emission device 15 to an H level and causes the light emission device 15 to emit strobe light. Then, in synchronization with the light emission signal, the exposure control unit 24 causes the pixel array unit 21 to perform the EIS imaging within the period during which the strobe light is emitted while the subject is being irradiated with the strobe light. As a result, an EIS image obtained by imaging the subject irradiated with the strobe light is acquired.

Thereafter, the exposure control unit 24 sets the light emission signal to be supplied to the light emission device 15 to the L level and terminates the light emission of the strobe light by the light emission device 15. Then, the exposure control unit 24 causes the pixel array unit 21 to perform the EIS imaging again as avoiding the timing at which the light emission of the strobe is finished and performs long-term EIS imaging based on the gyro data as described above with reference to FIGS. 3 and 4. As a result, an EIS image obtained by imaging a background where the strobe light does not reach is acquired.

In this manner, in the image pickup element 11, EIS imaging by the pixel array unit 21 is controlled in conjunction with the light emission signal (a control signal sent to outside) supplied to the light emission device 15 and, after an EIS image of the subject and an EIS image of its background are acquired, synthesizes those images. With this configuration, the image pickup element 11 can store an image in an environment with strobe light and an image in an environment without strobe light as a single EIS image.

Accordingly, a same effect as slow synchro imaging which is one of imaging techniques can be obtained. Here, FIG. 6 illustrates an example using front curtain synchronization; however, rear curtain synchronization may be employed.

Furthermore, also in a case where an EIS image of a subject and an EIS image of a background are synthesized, the image pickup element 11 can use gyro data and acquire an EIS image in which deviation is prevented.

Here, as described above, in addition to performing processing inside the image pickup element 11, for example, there may be a configuration that a motion vector based on the gyro data is added to the plurality of frames and output to a processor at the subsequent stage, and the synthesizing process is performed in the processor.

For example, in the conventional EIS imaging, since only one continuous frame is used in one imaging, in imaging using strobe light, synchronization has been needed to maintain a luminance uniformity within the screen even for a plurality of short-time exposure frames. However, it has been conventionally difficult to perform such control on a plurality of frames of short-time exposure.

On the other hand, in the image pickup element 11, the EIS imaging is performed twice at a high speed in succession, and motion vector information during the EIS imaging is maintained and used so that, while the apparent imaging time is elongated, a change in the imaging environment caused by the strobe light emission or the like can be handled. With this configuration, the image pickup element 11 can achieve high image quality in a low illuminance environment.

As described above, the image pickup element 11 continuously acquires a plurality of frames by EIS imaging, so that a better EIS image can be acquired in combination with the strobe light emission or the like even in a low illuminance environment.

Note that the above described image pickup element 11 is applicable to, for example, various electronic devices such as an image pickup system including a digital still camera or a digital video camera, a mobile phone having an image pickup function, or another device having an image pickup function.

Configuration Example of Image Pickup Device

Figure 7:
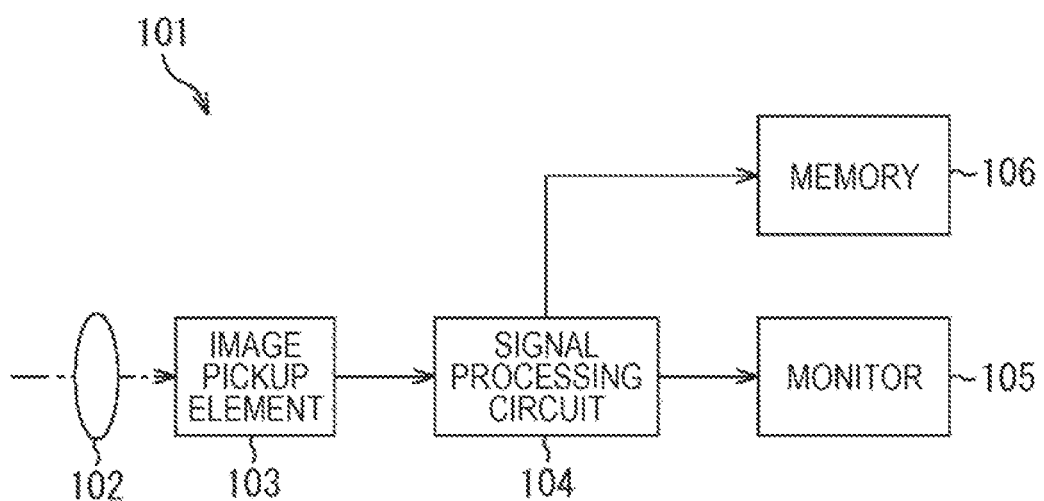
FIG. 7 is a block diagram illustrating a configuration example of an image pickup device.

FIG. 7 is a block diagram illustrating a configuration example of an image pickup device to be mounted in an electronic device.

As illustrated in FIG. 7, an image pickup device 101 includes an optical system 102, an image pickup element 103, a signal processing circuit 104, a monitor 105, and a memory 106, and can capture a still image and a moving image.

The optical system 102 includes one or a plurality of lenses, and guides the image light (incident light) from the subject to the image pickup element 103 to form an image on a light receiving surface (sensor section) of the image pickup element 103.

As the image pickup element 103, the above described image pickup element 11 is applied. In the image pickup element 103, electrons are accumulated for a certain period of time in accordance with an image formed on the light receiving surface via the optical system 102. Then, a signal corresponding to the electrons accumulated in the image pickup element 103 is supplied to the signal processing circuit 104.

The signal processing circuit 104 performs various signal processing on the pixel signal output from the image pickup element 103. An image (image data) obtained by performing signal processing by the signal processing circuit 104 is supplied to the monitor 105 and displayed, or supplied to the memory 106 and stored (recorded).

In the image pickup device 101 configured as described above, by applying the above described image pickup element 11, for example, a high quality image can be acquired even in a low illumination environment.

Usage Example of Image Sensor

Figure 8:
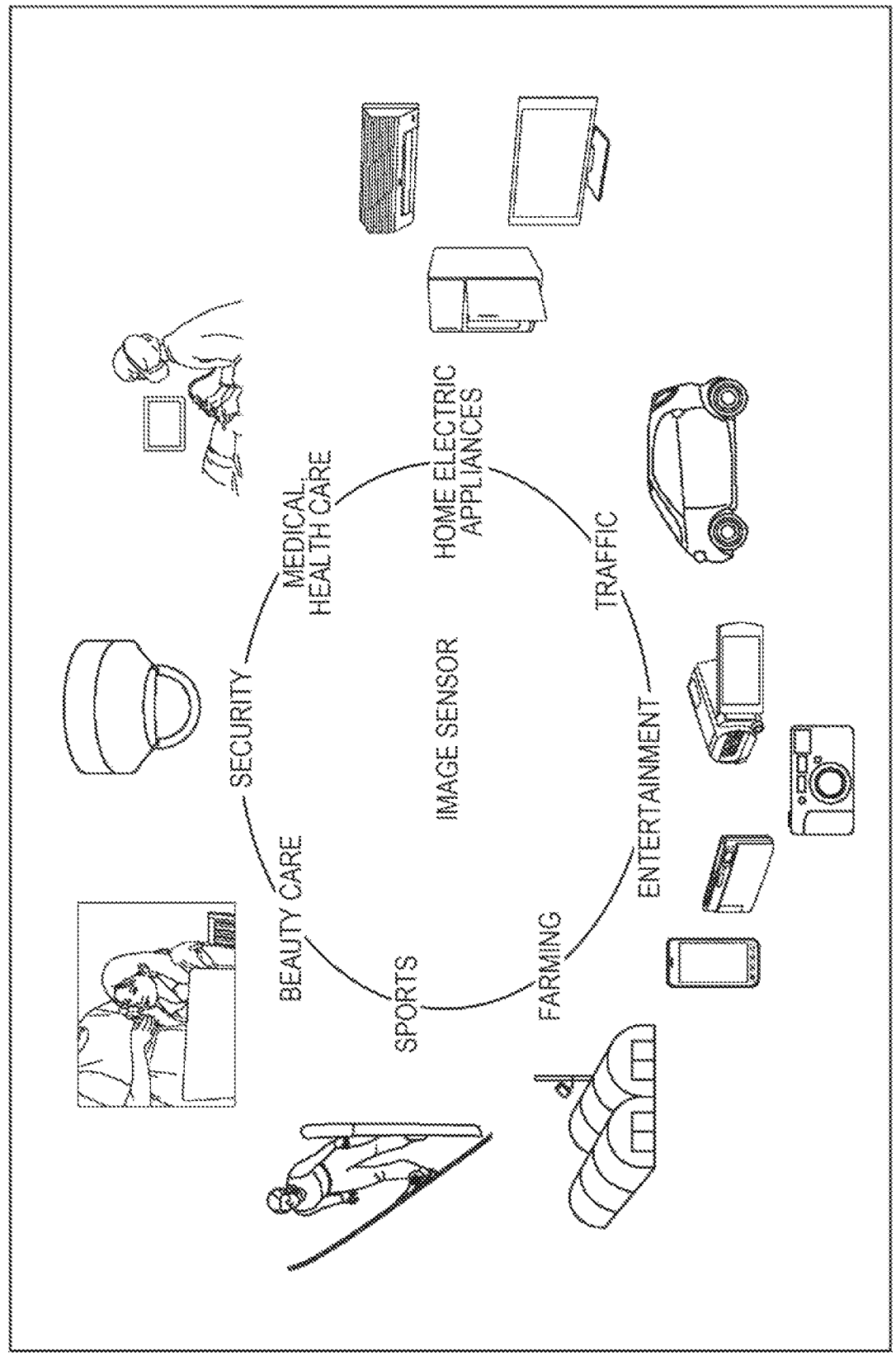
FIG. 8 is a diagram illustrating usage examples of an image sensor.

FIG. 8 is a diagram illustrating a usage example of the above described image sensor (image pickup element 11).

The above described image sensor can be used in various cases for sensing light such as visible light, infrared light, ultraviolet light, and X-rays, for example, as described below.

- An electronic device used to capture an image to be viewed, such as a digital camera, or a cell phone having a camera function
- A device used for traffic, such as a vehicle-mounted sensor for capturing an image in front and back of a vehicle, surroundings, vehicle interior or the like, a monitoring camera for monitoring traveling vehicles or streets, a distance measurement sensor for measuring a distance between vehicles, or the like in purpose of safe driving such as automatic stopping, recognition of driver's condition, and the like
- A device provided in home electric appliances such as a TV, a refrigerator, and an air conditioner, to capture an image of user's gesture and perform a device operation according to the gesture
- A device used in medical or health care, such as an endoscope and an angiography device using a reception of infrared light
- A device for security, such as a monitoring camera for crime prevention, or a camera for person identification
- A device for beauty care, such as a skin measurement device for capture an image of a skin, a microscope for capturing an image of a scalp, or the like
- A device for sports, such as an action camera, a wearable camera, or the like used for sports
- A device for farming, such as a camera for monitoring a condition of a field or farm products Note that the present technology may also have following configurations.

(1)

An image pickup element including:

a pixel array unit including a plurality of pixels arranged in an array and configured to output a plurality of frames by electronic image stabilization (EIS) imaging that continuously performs short-time exposure imaging at high speed; and an exposure control unit configured to determine whether or not a blur of the pixel array unit exceeds a prescribed value on the basis of blur information indicating a physical blur in a case where the pixel array unit is shaken, and cause the pixel array unit to perform EIS imaging until it is determined that the blur of the pixel array unit exceeds the prescribed value.

(2)

The image pickup element according to (1), in which even in a case where an exposure time given from an external processor has passed, the exposure control unit causes the pixel array unit to perform EIS imaging until it is determined that the blur of the pixel array unit exceeds the prescribed value.

(3)

The image pickup element according to (1), in which even in a case where an exposure time given from an external processor has not passed, the exposure control unit causes the pixel array unit to terminate the EIS imaging in a case where it is determined that the blur of the pixel array unit exceeds a prescribed value.

(4)

The image pickup element according to any one of (1) to (3), further including an image synthesis unit configured to perform image processing for shifting a plurality of frames output from the pixel array unit in a direction to correct the blur according to the blur information and synthesizing the frames.

(5)

The image pickup element according to (4), in which the image synthesis unit performs image processing for synthesizing the frames using the blur information synchronized with each position in the frames captured by the pixel array unit.

(6)

The image pickup element according to any one of (1) to (5), in which the exposure control unit controls EIS imaging of the pixel array unit in conjunction with a control signal for performing predetermined control of an external device.

(7)

An image pickup method of an image pickup device having a pixel array unit including a plurality of pixels arranged in an array and outputting a plurality of frames by electronic image stabilization (EIS) imaging that continuously performs short-time exposure imaging at high speed, the method including:

determining whether or not a blur of the pixel array unit exceeds a prescribed value on the basis of blur information indicating a physical blur in a case where the pixel array unit is shaken; and causing the pixel array unit to perform EIS imaging until it is determined that the blur of the pixel array unit exceeds the prescribed value.

(8)

An electronic device having an image pickup element, the image pickup element including:

a pixel array unit including a plurality of pixels arranged in an array and configured to output a plurality of frames by electronic image stabilization (EIS) imaging that continuously performs short-time exposure imaging at high speed; and an exposure control unit configured to determine whether or not a blur of the pixel array unit exceeds a prescribed value on the basis of blur information indicating a physical blur in a case where the pixel array unit is shaken, and cause the pixel array unit to perform EIS imaging until it is determined that the blur of the pixel array unit exceeds the prescribed value.

Note that the present embodiment is not limited to the above described embodiment and various changes can be made within the scope of the present disclosure.

REFERENCE SIGNS LIST

11 Image pickup element
12 Imaging chip
13 Memory chip
14 Gyro sensor
15 Light emission device
21 Pixel array unit 22 ADC unit
23 Gyro interface unit
24 Exposure control unit
25 Image synthesis unit
26 Output frame configuration unit
27 Output unit
28 Input unit
29 Image data buffer

The invention claimed is:

1. An image pickup element, comprising:
a pixel array unit that comprises a plurality of pixels in an array, wherein
the pixel array unit is configured to output a plurality of frames based on an electronic image stabilization (EIS) imaging operation, and
a short-time exposure imaging operation is continuously executed at a high speed in the EIS imaging operation; and
circuitry configured to:
receive control information from an external processor, wherein the control information indicates an exposure time;
determine that a value of a blur of the pixel array unit exceeds a specific value before elapse of the exposure time, wherein
the value of the blur is determined to exceed the specific value based on blur information, and
the blur information indicates a physical blur corresponding to a shake of the pixel array unit; and
control the pixel array unit to terminate the EIS imaging operation before the elapse of the exposure time, wherein the EIS imaging operation terminates when the value of the blur of the pixel array unit is determined to exceed the specific value.

2. The image pickup element according to claim 1, wherein
the circuitry is further configured to shift the plurality of frames output from the pixel array unit,
the plurality of frames is shifted in a specific direction to correct the blur, and
the specific direction is based on a direction of the shake of the pixel array unit.

3. The image pickup element according to claim 2, wherein the circuitry is further configured to synchronize the plurality of frames.

4. The image pickup element according to claim 1, wherein the circuitry is further configured to control the EIS imaging operation of the pixel array unit based on a specific control signal.

5. An image pickup method, comprising:
in an image pickup device that comprises a pixel array unit, wherein the pixel array unit comprises a plurality of pixels in an array:
outputting a plurality of frames based on an electronic image stabilization (EIS) imaging operation, wherein a short-time exposure imaging operation is continuously executed at a high speed in the EIS imaging operation;
receiving control information from an external processor, wherein the control information indicates an exposure time;
determining that a value of a blur of the pixel array unit exceeds a specific value before elapse of the exposure time, wherein
the value of the blur is determined to exceed the specific value based on blur information, and
the blur information indicates a physical blur corresponding to a shake of the pixel array unit; and
controlling the pixel array unit to terminate the EIS imaging operation before the elapse of the exposure time, wherein the EIS imaging operation terminates when the value of the blur of the pixel array unit is determined to exceed the specific value.

6. An electronic device, comprising:
an image pickup element, wherein the image pickup element comprises:
a pixel array unit that comprises a plurality of pixels in an array, wherein
the pixel array unit is configured to output a plurality of frames based on an electronic image stabilization (EIS) imaging operation, and
a short-time exposure imaging operation is continuously executed at a high speed in the EIS imaging operation; and
circuitry configured to:
receive control information from an external processor, wherein the control information indicates an exposure time;
determine that a value of a blur of the pixel array unit exceeds a specific value before elapse of the exposure time, wherein
the value of the blur is determined to exceed the specific value based on blur information, and
the blur information indicates a physical blur corresponding to a shake of the pixel array unit; and
control the pixel array unit to terminate the EIS imaging operation before the elapse of the exposure time, wherein the EIS imaging operation terminates when the value of the blur of the pixel array unit exceeds the specific value.

7. The image pickup element according to claim 1, wherein the circuitry is further configured to:
control emission of a strobe light at a first timing;
control the pixel array unit to execute the EIS imaging operation, at the first timing, in synchronization with the emission of the strobe light, wherein the EIS imaging operation is executed to obtain a first image;
control termination of the emission of the strobe light at a second timing different from the first timing;
control the pixel array unit to execute the EIS imaging operation at the second timing without the emission of the strobe light to obtain a second image;
synthesize the first image and the second image; and
acquire an EIS image based on the synthesis of the first image and the second image.

* * * * *